(12) United States Patent
Philippe

(10) Patent No.: US 8,200,170 B2
(45) Date of Patent: Jun. 12, 2012

(54) CANCELLATION OF OSCILLATOR REMODULATION

(75) Inventor: Pascal Philippe, Caen (FR)

(73) Assignee: NXP B.V., Eindhoven (NL)

( * ) Notice: Subject to any disclaimer, the term of this patent is extended or adjusted under 35 U.S.C. 154(b) by 50 days.

(21) Appl. No.: 12/936,443

(22) PCT Filed: Apr. 2, 2009

(86) PCT No.: PCT/IB2009/051394
§ 371 (c)(1),
(2), (4) Date: Oct. 5, 2010

(87) PCT Pub. No.: WO2009/125321
PCT Pub. Date: Oct. 15, 2009

(65) Prior Publication Data
US 2011/0034136 A1  Feb. 10, 2011

(30) Foreign Application Priority Data
Apr. 7, 2008  (EP) ..................................... 08103405

(51) Int. Cl.
*H04B 1/04* (2006.01)

(52) U.S. Cl. ............... 455/114.3; 455/114.2; 455/127.1; 455/127.2; 455/127.3; 455/126; 375/295; 375/297

(58) Field of Classification Search ............... 455/114.3, 455/114.2, 127.1, 127.2, 127.3, 126; 375/295, 375/297
See application file for complete search history.

(56) References Cited

U.S. PATENT DOCUMENTS

| 5,066,922 | A |   | 11/1991 | Leitch |
| 5,121,077 | A | * | 6/1992 | McGann ....................... 330/149 |
| 5,535,247 | A |   | 7/1996 | Gailus et al. |
| 5,793,817 | A | * | 8/1998 | Wilson .......................... 375/297 |
| 5,963,847 | A | * | 10/1999 | Ito et al. .......................... 455/17 |
| 6,639,950 | B1 | * | 10/2003 | Lagerblom et al. ........... 375/297 |
| 7,599,669 | B2 | * | 10/2009 | Boos .......................... 455/114.3 |
| 2003/0109222 | A1 |  | 6/2003 | Sun et al. |
| 2005/0032483 | A1 |  | 2/2005 | Klomsdorf et al. |
| 2006/0067427 | A1 |  | 3/2006 | Zolfaghari et al. |

FOREIGN PATENT DOCUMENTS

| EP | 0 441 579 A1 | 8/1991 |
| EP | 0 567 380 A1 | 10/1993 |
| GB | 2 240 893 A | 8/1991 |
| WO | 01/43275 A2 | 6/2001 |

OTHER PUBLICATIONS

Maillard, X., et al "A 900-Mb/s CMOS Data Recovery DLL Using Half-Frequency Clock," IEEE J. of Solid-State Circuits, vol. 37, No. 6, pp. 711-715 (Jun. 2002).
Chang, H.-H. et al, "A Wide-Range Delay-Locked Loop With a Fixed Latency of One Clock Cycle," IEEE J. of Solid-State Circuits, vol. 37, No. 8, pp. 1021-1027 (Aug. 2002).
Hietala, A. "A Quad-Band 8PSK/GMSK Polar Tranceiver," IEEE J. of Solid State Circuits, vol. 41, No. 5, pp. 1133-1141 (May 2006).
International Search Report and Written Opinion for int'l. patent appln. No. PCT/IB2009/051394 (Apr. 2, 2009).

* cited by examiner

*Primary Examiner* — Sanh Phu

(57) ABSTRACT

A wireless transmitter (100) comprises a signal generator (10) for generating a signal, an amplifier (50) for amplifying the signal, and a phase shifting circuit (20) coupled between the signal generator (10) and the amplifier (50) and arranged to shift the phase of the signal to cancel remodulation of the signal generator (10) by the amplified signal.

13 Claims, 1 Drawing Sheet

CANCELLATION OF OSCILLATOR REMODULATION

FIELD OF THE INVENTION

The invention relates to a wireless transmitter and to a method of operating such a transmitter. The invention has application in particularly, but not exclusively, polar transmitters.

BACKGROUND TO THE INVENTION

In a radio frequency (RF) transmitter comprising an oscillator and a power amplifier, oscillator remodulation can occur because of RF coupling between the power amplifier and the oscillator. This coupling is particularly likely to occur in transmitters where the power amplifier and the oscillator are manufactured in the same integrated circuit (IC) or in the same device package. As a result of the coupling, a fraction of the output power is injected back into the oscillator circuit as an unwanted parasitic signal. This parasitic signal can disturb the operation of the oscillator, especially if the parasitic signal has spectral content close to the oscillation frequency, where the oscillator is particularly sensitive. In response to such a close-frequency perturbation, the oscillator will be phase or frequency modulated. This phenomenon is known as remodulation. Remodulation is more likely to happen in transmitters in which the oscillator runs at the fundamental transmit frequency or at an integer multiple of that frequency. If the oscillator runs at the fundamental transmit frequency, it is the fundamental frequency of the amplifier output signal itself that causes remodulation, whereas if the oscillator runs at n times the transmit frequency, remodulation is caused by the n-th harmonic of the amplifier output signal.

RF transmitters using a polar architecture are becoming popular in modern wireless communications systems. For example, such polar transmitters are used in mobile telephones conforming to the GSM and EDGE standards, but it is anticipated that the polar architecture will increasingly be used in products conforming to other standards such Bluetooth, DECT, UMTS and other 3G cellular standards, WLAN and Wimax.

Polar transmitters, in which the carrier frequency follows that of the oscillator by construction, are less subject to oscillator remodulation than Cartesian transmitters. However remodulation can nevertheless happen in a polar transmitter due to amplitude variations of the output signal, as occurs with non-constant envelope modulation.

One form of polar transmitter is a "direct" polar transmitter which does not have a feedback loop to correct for imperfections in the amplitude and frequency paths of the transmitter. A typical example of "direct" polar transmitter architecture is described in "A Quad-Band 8PSK/GMSK Polar Transceiver", Hietala, A. W., IEEE Journal of Solid-State Circuits, vol. 41, no. 5, May 2006, pp. 1133-1141.

An object of the invention is to reduce remodulation in a wireless transmitter.

SUMMARY OF THE INVENTION

According to a first aspect of the invention there is provided a wireless transmitter comprising:
a signal generator for generating a signal;
an amplifier for amplifying the signal;
a phase shifting circuit coupled between the signal generator and the amplifier and arranged to shift the phase of the signal to cancel remodulation of the signal generator by the amplified signal.

According to a second aspect of the invention there is provided a method of operating a wireless transmitter, comprising:
generating a signal by means of a signal generator;
amplifying the signal;
prior to amplifying the signal, phase shifting the signal to cancel remodulation of the signal generator by the amplified signal.

By shifting the phase of the signal in the forward path of the transmitter by an appropriate amount, remodulation by the transmitter output signal can be reduced or eliminated.

Optionally, the phase shifting circuit may be adapted to provide an adjustable phase shift, and the wireless transmitter may comprise a controller adapted to adjust the phase shift to reduce remodulation of the signal generator by the amplified signal. This enables the phase shift to be optimised for an individual transmitter, which can take account of IC process variations, and also enables repeated optimisation during the life of the transmitter in case of variations in the transmitter circuit performance due to, for example, temperature or voltage changes.

Optionally, the controller may comprise a measurement device for generating an indication of distortion in the amplified signal, and the controller may be adapted to reduce the remodulation by adjusting the phase shift to reduce the distortion. This provides a way of optimising the phase delay in a manner that is directly related to the quality of the transmitted signal.

Optionally, the controller may be adapted to adjust the phase shift whilst the amplifier maintains a constant mean output power. This simplifies determination of the optimum phase shift.

Optionally, the signal generator may comprise an oscillator and a divider, and the remodulation of the signal generator may comprise remodulation of the oscillator. Thus the invention is applicable when remodulation of an oscillator is caused by a transmitter output signal having a frequency that is not close to the frequency of the oscillator.

BRIEF DESCRIPTION OF THE DRAWINGS

The invention will now be described, by way of example only, with reference to the accompanying drawings wherein.

DETAILED DESCRIPTION OF THE INVENTION

Figure 1:
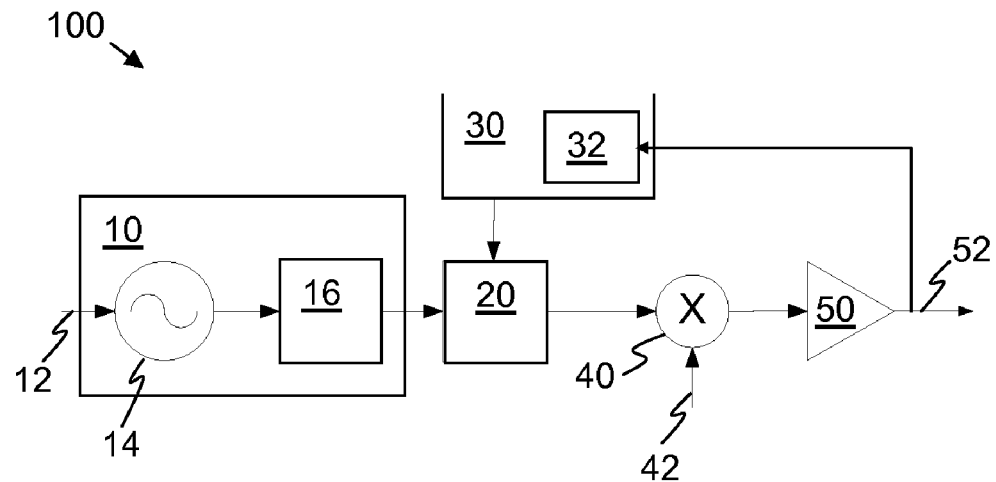
FIG. 1 is a block schematic diagram of a wireless transmitter.

Referring to FIG. 1, there is illustrated a transmitter 100 comprising a signal generator 10 which includes an oscillator 14 for generating an oscillator signal and a divider 16 coupled to an output of the oscillator 14 for dividing the frequency of the oscillator signal. The oscillator 14 is a voltage controlled oscillator, and it has an input 12 for a first modulation signal for modulating the frequency of the oscillator signal. An output of the signal generator 10, coupled to an output of the divider 16, is coupled to an input of a phase shifting circuit 20 for phase shifting the signal delivered by the signal generator 10.

A controller 30 is coupled to an input of the phase shifting circuit 20 for controlling the extent of the phase shift. An output of the phase shifting circuit 20 is coupled to a first input of a mixer 40 for amplitude modulating the signal delivered by the phase shifting circuit 20 with a second modulation signal provided at a second input 42 of the mixer 40. An output of the mixer 40 is coupled to an input of an amplifier 50 for delivering a transmitter output signal at an output 52, for coupling to a non-illustrated antenna.

The controller 30 comprises a monitoring circuit 32 which is coupled to the output 52 of the amplifier 50 for monitoring the quality of the transmitter output signal. The quality of the transmitter output signal may be assessed by measuring the amount of energy of the output signal that falls outside of a desired bandwidth, which is indicative of distortion caused by remodulation. The phase shift may be adjusted by the controller 30 to minimise the energy outside of the desired bandwidth, thereby minimising remodulation, or to reduce the that energy below a target value, thereby reducing remodulation to an acceptable value.

The remodulation of the oscillator 14 can be characterised by the frequency deviation $\Delta f(t)$ introduced to the oscillator frequency. This frequency deviation may be, for a polar transmitter, expressed in terms of the amplitude $A(t)$ of the fundamental frequency, or relevant harmonic frequency, of the transmitter output signal as $$\Delta f(t) = K^* A(t)^* \sin(\phi) \tag{1}$$

where $\phi$ is the phase difference between the transmitter output signal and the oscillator signal. K is a gain factor that is proportional to the coupling factor between the amplifier 50 and the oscillator 14, and is also proportional to the intrinsic susceptibility of the oscillator 14 to remodulation. By adjusting the phase difference $\phi$, the value of $\sin(\phi)$ can become zero, in which case the frequency deviation $\Delta f(t)$ is zero and the remodulation is cancelled. The phase difference $\phi$ consists of a phase shift introduced by the phase shifting circuit 20, and the phase shift inherent in the other transmitter circuits between the oscillator 14 and the transmitter output 52. Therefore, the phase shift introduced by the phase shifting circuit 20 is selected to ensure that the value of $\sin(\phi)$ is minimised, or at least reduced, ideally to zero.

The phase shift introduced by the phase shifting circuit 20 is controlled by the controller 30. As the phase shift between zero and maximum remodulation is 90°, corresponding to one quarter of period of the oscillator signal, the phase shift provided by the phase shifting circuit 20 is preferably controllable over at least that range. The phase shifting circuit 20 may be digitally controlled using a binary control word provided by the controller 30. For example, with a 3-bit binary control word, a 90° range of phase shifts may be provided in increments of 90°/8=11.25°. With such increments, the adjusted phase can be at most 5.625° from its optimum value, so the remodulation can be attenuated to at least)20*log(sin 5.625°)=−20 dB, compared to its maximum value for 90°. The controller 30 controls the phase shift in response to monitoring the transmitter output signal, as described above.

The phase shifting circuit 20 with digital control may be implemented as a digital to analogue converter coupled to a voltage controlled delay cell. The voltage-controlled delay cell can be implemented in several well known ways. Typically, their operation relies on varying the charge time of a capacitive node by varying the loading current or the resistance in parallel to the capacitance. CMOS voltage controlled delay cells are described in "A 900-Mb/s CMOS Data Recovery DLL Using Half-Frequency Clock", Maillard, X. et al, IEEE Journal of Solid-State Circuits, vol. 37, no. 6, June 2002, pp. 711-715 and in "A Wide-Range Delay-Locked Loop With a Fixed Latency of One Clock Cycle", Chang et al, IEEE Journal of Solid-State Circuits, vol. 37, no. 8, August 2002, pp. 1021-1027.

Another possible implementation the phase shifting circuit 20 is based on an all-pass filter. This approach requires sine wave input signals, so is particularly suited to architectures where the oscillator 14 runs at the fundamental frequency of the carrier of the transmitter output signal, thereby avoiding the need for the divider 16. In this case, the all-pass filter can be placed immediately after the oscillator.

Figure 2:
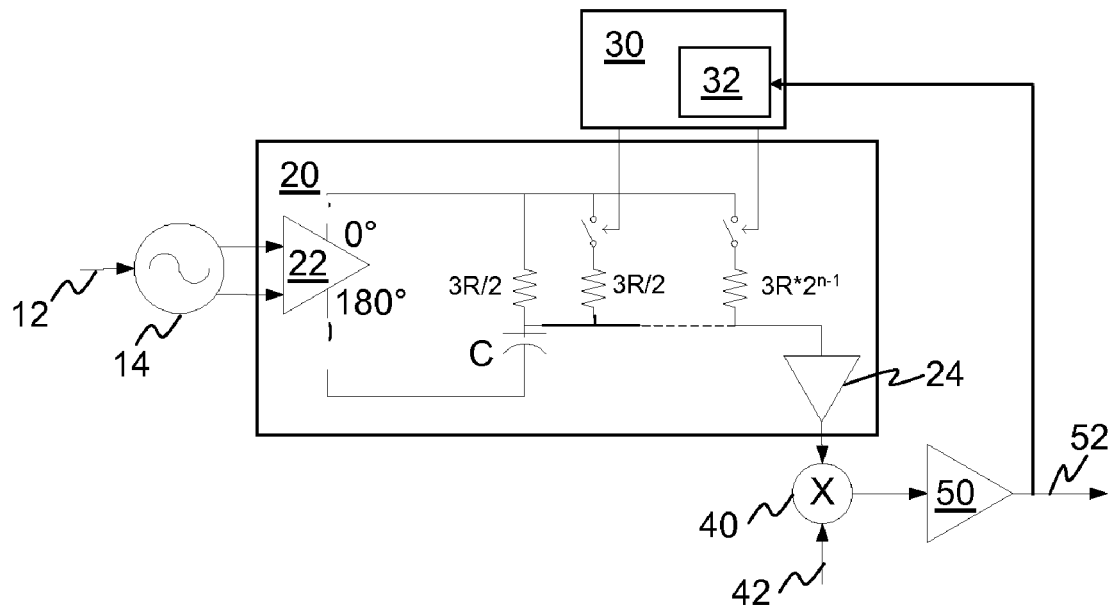
FIG. 2 is a block schematic diagram of another wireless transmitter.

Such a transmitter is illustrated in FIG. 2. The input 12, monitoring circuit 32, mixer 40, second input 42, amplifier 50 and output 52 perform the corresponding function to those identically numbered elements of FIG. 1, so will not be described again. The phase shifting circuit 20 comprises an all-pass filter, as follows. The oscillator 14 has a pair of outputs that provides a differential pair of oscillator signals 180° out of phase. The differential oscillator signals are amplified by an amplifier 22. A first resistor of value $3R/2$ and a capacitor C are coupled in series between differential outputs of the amplifier 22. Further resistors having values $3R/2^i$, $i=0 \ldots n-1$, are coupled in parallel with the first resistor by means of switches that enable each of the further resistors to be switched to open circuit. The controller 30 controls the switches to control which of the further resistors are in circuit and which are open circuit. The output of the phase shifting circuit 20 is provided from the junction of the first resistor and the capacitor C, via a buffer amplifier 24.

The phase shift of the all-pass filter as a function of frequency $\omega$ is $-2 \cdot \arctan(\omega RC)$. Around the centre frequency determined by $\omega RC=1$, the phase shift varies nearly linearly with RC for variations of up to +/−45°. This range is employed to switch the phase in increments by switching the combined resistance from $R/2$, when all resistors are in circuit, to $3*R/2$ when only the first resistor is in circuit.

Although embodiments have been described in which the phase shifting circuit 20 provides a variable phase shift, it may alternatively provide a fixed phase shift. In this case the required value of the phase shift may be determined initially using a variable phase shift, at the design stage of the transmitter, and then the transmitter may be manufactured using a phase shifting circuit providing the required fixed value of phase shift.

Although, in the embodiment illustrated in FIG. 1, the phase shifting circuit is coupled between the divider 16 and the mixer 40, it could alternatively be coupled between the oscillator 14 and the divider 16.

Although the embodiments described include provision for frequency modulation, this is not essential to the invention. However, for embodiments having provision for frequency modulation, the frequency modulation should be applied to the oscillator 14.

Although the embodiments described have provision for amplitude modulation by means of a mixer 40, alternatively the amplifier 50 may be provided with means for applying amplitude modulation, for example by modulating a power supply of the amplifier 50.

Embodiments of the transmitter may include additional circuit blocks, such as filters and upconversion stages.

Other techniques than those described may be used for assessing spectrum quality, for assessing the quality of the transmitter output signal, and for assessing the extent of remodulation.

From reading the present disclosure, other variations and modifications will be apparent to the skilled person. Such variations and modifications may involve equivalent and other features which are already known in the art of transmitter design, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A wireless transmitter comprising:
    a signal generator configured to receive an input modulation signal to generate a modulated signal;
    an amplifier configured to amplify the modulated signal; and
    a phase shifting circuit coupled between the signal generator and the amplifier and arranged to shift a phase of the modulated signal to cancel remodulation of the signal generator by the amplified modulated signal.

2. A wireless transmitter as claimed in claim 1, wherein the phase shifting circuit is configured to provide an adjustable phase shift, and further comprising:
    a controller configured to adjust the phase shift to reduce remodulation of the signal generator by the amplified modulated signal.

3. A wireless transmitter as claimed in claim 2, wherein the controller comprises a measurement device for generating an indication of distortion in the amplified modulated signal and is configured to reduce the remodulation by adjusting the phase shift to reduce the indicated distortion.

4. A wireless transmitter as claimed in claim 2, wherein the controller is configured to adjust the phase shift while the amplifier maintains a constant mean output power.

5. A wireless transmitter as claimed in claim 1, wherein the signal generator comprises an oscillator and a divider and the remodulation of the signal generator comprises remodulation of the oscillator.

6. A wireless transmitter as claimed in claim 1, further comprising:
    a modulator configured to amplitude modulate the phase shifted modulated signal.

7. A wireless transmitter as claimed in claim 6, wherein the amplifier comprises the modulator.

8. A wireless transmitter as claimed in claim 1, wherein the wireless transmitter is a polar transmitter.

9. A wireless transmitter comprising:
    a signal generator configured to receive an input modulation signal to generate a modulated signal, wherein the signal generator comprises an oscillator and the signal generator is configured for frequency modulation of the oscillator;
    an amplifier configured to amplify the modulated signal; and
    a phase shifting circuit coupled between the signal generator and the amplifier and arranged to shift a phase of the modulated signal to cancel remodulation of the signal generator by the amplified modulated signal.

10. A method of operating a wireless transmitter, comprising:
    receiving an input modulation signal to generate a modulated signal with a signal generator;
    amplifying the modulated signal with an amplifier; and
    prior to amplifying the modulated signal, phase shifting the modulated signal to cancel remodulation of the signal generator by the amplified modulated signal.

11. A method as claimed in claim 10, further comprising:
    adjusting a phase shift to reduce remodulation of the signal generator by the amplified modulated signal.

12. A method as claimed in claim 11, further comprising:
    adjusting the phase shift while the amplifier maintains a constant mean output power.

13. A method as claimed in claim 11, further comprising:
    generating an indication of distortion in the amplified modulated signal, wherein adjusting the phase shift to reduce the remodulation comprises adjusting the phase shift to reduce the indicated distortion.

* * * * *